US009118315B2

(12) United States Patent
P et al.

(10) Patent No.: US 9,118,315 B2
(45) Date of Patent: Aug. 25, 2015

(54) SCHEME TO IMPROVE THE PERFORMANCE AND RELIABILITY IN HIGH VOLTAGE IO CIRCUITS DESIGNED USING LOW VOLTAGE DEVICES

(71) Applicant: Texas Instruments Incorporated, Dallas, TX (US)

(72) Inventors: Venkateswara Reddy P, Bangalore (IN); Vinayak Ghatawade, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/494,927

(22) Filed: Sep. 24, 2014

(65) Prior Publication Data

US 2015/0130511 A1 May 14, 2015

Related U.S. Application Data

(60) Provisional application No. 61/902,975, filed on Nov. 12, 2013.

(51) Int. Cl.
*H03K 19/0175* (2006.01)
*H03K 19/003* (2006.01)
*H03K 19/017* (2006.01)

(52) U.S. Cl.
CPC .. *H03K 19/00361* (2013.01); *H03K 19/017509* (2013.01); *H03K 19/01714* (2013.01)

(58) Field of Classification Search
CPC ............... H03K 19/0175; H03K 19/01714
USPC ....................... 326/26, 27, 83, 88
See application file for complete search history.

(56) References Cited

U.S. PATENT DOCUMENTS

| | | | | |
|---|---|---|---|---|
| 6,097,237 A | * | 8/2000 | Singh | 327/389 |
| 2006/0125759 A1 | * | 6/2006 | An | 345/98 |
| 2009/0085606 A1 | * | 4/2009 | Chandra Sunil | 326/81 |
| 2010/0066446 A1 | * | 3/2010 | Basten | 330/251 |

* cited by examiner

*Primary Examiner* — Don Le
(74) *Attorney, Agent, or Firm* — John R. Pessetto; Charles A. Brill; Frank D. Cimino

(57) ABSTRACT

A high voltage input/output (IO) circuit designed using low voltage devices. The IO circuit receives a first bias voltage and a second bias voltage. The IO circuit includes a pre-reverse switch, a main-driver and a post-reverse switch. The pre-reverse switch includes a first capacitor and a second capacitor. The main-driver includes a first parasitic capacitance and a second parasitic capacitance. The post-reverse switch includes a third capacitor and a fourth capacitor. The first capacitor and the third capacitor counter an effect of coupling by the first parasitic capacitance on the first bias voltage and the second capacitor and the fourth capacitor counter an effect of coupling by the second parasitic capacitance on the second bias voltage.

21 Claims, 5 Drawing Sheets

SCHEME TO IMPROVE THE PERFORMANCE AND RELIABILITY IN HIGH VOLTAGE IO CIRCUITS DESIGNED USING LOW VOLTAGE DEVICES

CROSS REFERENCES TO RELATED APPLICATIONS

This application claims priority from U.S. provisional patent application No. 61/902,975 filed on Nov. 12, 2013, which is hereby incorporated by reference in its entirety.

TECHNICAL FIELD

Embodiments of the disclosure relate generally to integrated circuits (ICs) and more particularly to input/output (IO) circuits in ICs.

BACKGROUND

An integrated circuit (IC) includes core logic and input/output (IO) circuits. The core logic performs a desired function and requires a low voltage termed as core supply voltage. The IC communicates with other ICs or external devices (filters, sensors etc.) at high voltage range termed as the supply voltage. The IO circuits acts as interface and communicate data between core logic and external devices. The IO circuits are connected to external devices through board traces or metal wires, called transmission lines. An IO circuit includes a main-driver that drives signals on a pad to interface with the external devices. A bidirectional IO circuit has a main-driver used for sending signals to the external devices (transmit mode) and a receiver circuit for receiving signals from the external devices (receive mode).

The IO circuits need to generate output signals to drive external devices, with suitable voltage levels compatible with the specifications of external devices, to ensure that the data is accurately transferred to the external devices. High voltage IO circuits require high voltage output signals to comply with the specifications of the external device. For example, if an external device is designed to receive input signals at +5 Volts, then output signals need to be at a maximum voltage of +5V. However, the high voltage IO circuits are generally implemented using low voltage transistors. In general, using low voltage transistors provides benefits such as high throughput performance, reduced electrical power consumption, lower number of fabrication masks (leading to lower fabrication costs) and high density (number of integrated circuits in a unit area). The low voltage transistors are driven by bias voltages. The use of low voltage transistors in high voltage IO circuit causes coupling of transitions in high voltage output signal to the bias voltages through parasitic capacitances of the low voltage transistors. Stabilizing the bias voltages either requires a large static current or a large capacitor. However, these solutions increase the size of the IO circuit and also result in jitter in the output signals of the IO circuit.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides an input/output (IO) circuit. The IO circuit includes a pre-reverse switch that receives a pair of input voltages. The pre-reverse switch includes a first capacitor and a second capacitor. A main-driver is coupled to the pre-reverse switch and a pad. The main-driver receives a first bias voltage and a second bias voltage and generates a main-driver output voltage. The main-driver includes a first parasitic capacitance and a second parasitic capacitance. The first parasitic capacitance couples the main-driver output voltage to the first bias voltage and the second parasitic capacitance couples the main-driver output voltage to the second bias voltage. A post-reverse switch is coupled to the main-driver. The post-reverse switch includes a third capacitor and a fourth capacitor. The first capacitor and the third capacitor counter an effect of coupling by the first parasitic capacitance on the first bias voltage and the second capacitor and the fourth capacitor counter an effect of coupling by the second parasitic capacitance on the second bias voltage.

Another embodiment provides a method to counter an effect of coupling on bias voltages in an IO circuit. The method includes receiving a first input voltage and a second input voltage in an input/output (IO) circuit. A first output voltage, a second output voltage and a pre-reverse switch output voltage are generated from the first input voltage and a second input voltage. The pre-reverse switch output voltage is coupled to a first bias voltage and to a second bias voltage. A third output voltage, a fourth output voltage and a main-driver output voltage is generated from the first output voltage and the second output voltage. The main-driver output voltage is coupled to the first bias voltage and to the second bias voltage. A post-reverse switch output voltage is generated from the third output voltage and the fourth output voltage. The post-reverse switch output voltage is coupled to the first bias voltage and to the second bias voltage. The coupling of the pre-reverse switch output voltage and the post-reverse switch output voltage to the first bias voltage counter an effect of coupling the main-driver output voltage to the first bias voltage. The coupling of the pre-reverse switch output voltage and the post-reverse switch output voltage to the second bias voltage counter an effect of coupling the main-driver output voltage to the second bias voltage.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
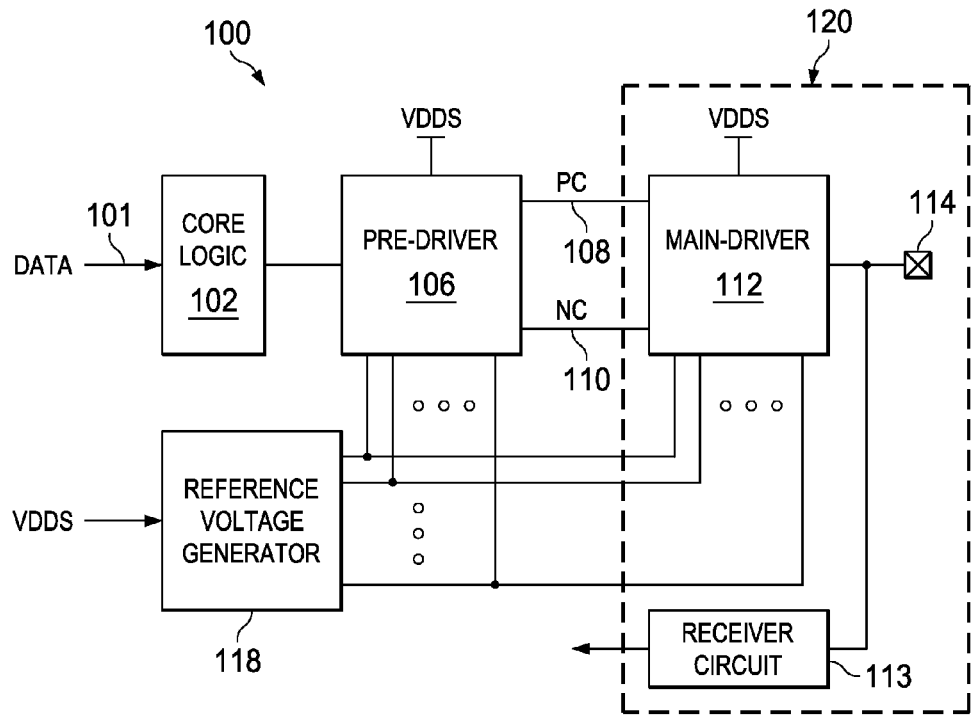
FIG. 1 illustrates a block diagram of an example environment of an integrated circuit (IC) in which several aspects of the present disclosure may be implemented.

FIG. 1 illustrates a block diagram of an example environment of an integrated circuit (IC) 100 in which several aspects of the present disclosure may be implemented. The IC 100 includes a core logic 102 that is configured to receive a data 101. The core logic 102 is coupled to the pre-driver 106. The pre-driver 106 is coupled to an input/output (IO) circuit 120. The IO circuit 120 receives a first input voltage (PC) 108 and a second input voltage (NC) 110 from the pre-driver 106. The IO circuit 120 includes a main-driver 112, a receiver circuit 113 and a pad 114. The main-driver 112 is coupled to the pad 114. The receiver circuit 113 is coupled to the main-driver 112 and the pad 114. The main-driver 112 receives the first input voltage (PC) 108 and the second input voltage (NC) 110. The IC 100 includes a reference voltage generator 118 that receives a supply voltage VDDS. The reference voltage generator generates a set of bias voltages. The set of bias voltages include at least one of a first bias voltage (Vp) and a second bias voltage (Vn). The set of bias voltages are supplied to the pre-driver 106 and the main-driver 112. The pre-driver 106 and the main-driver 112 also receive the supply voltage VDDS. The integrated circuit 100 may include one or more additional components known to those skilled in the relevant art and are not discussed here for simplicity of the description.

The operation of the circuit on integrated circuit 100 illustrated in FIG. 1 is explained now. The core logic 102 performs various operations on the data 101 and provides the resulting data to the pre-driver 106. The pre-driver 106 receives the data from the core logic 102 and generates the first input voltage (PC) 108 and the second input voltage (NC) 110. The pre-driver 106 also inverts the data received from the core logic 102 without altering the data in the signals. The main-driver 112 is used for sending signals to an external device (transmit mode) and a receiver circuit 113 is used for receiving signals from the external device (receive mode). Generally, the main-driver 112 is tri-stated during the receive mode. The main-driver 112 generates output signal with a voltage level equaling the specifications of an external device. The output signal is generated based on the first input voltage (PC) 108 and the second input voltage (NC) 110 received from the pre-driver 106. The output signal is provided through the pad 114 to the external device.

Figure 2:
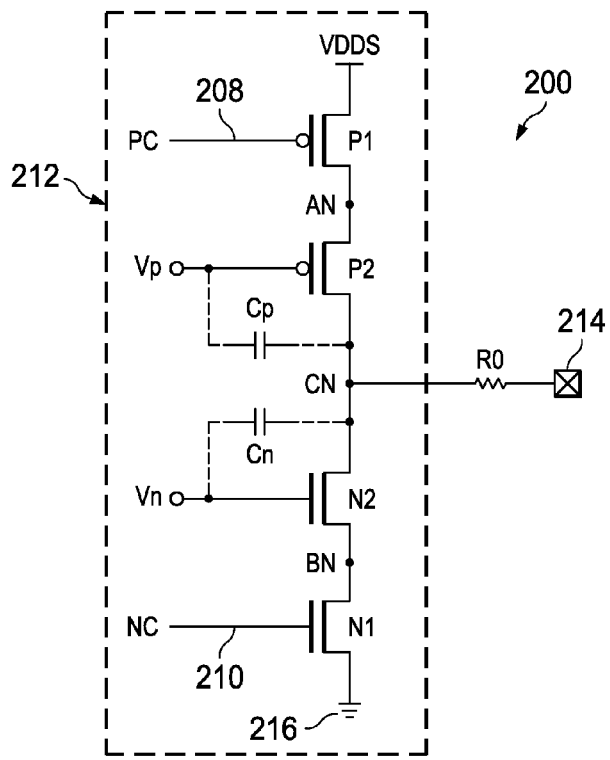
FIG. 2 illustrates a circuit schematic of an input/output (IO) circuit.

FIG. 2 illustrates a circuit schematic of an input/output (IO) circuit 200. The IO circuit 200 is a circuit schematic of the block diagram of the IO circuit 120 illustrated in FIG. 1. The IO circuit 200 includes a main-driver 212, a resistor Ro and a pad 214. The main-driver 212 includes a first PMOS transistor P1, a second PMOS transistor P2, a first NMOS transistor N1 and a second NMOS transistor N2. The main-driver 212 receives a first input voltage (PC) 208 and a second input voltage (NC) 210 from a pre-driver (not illustrated in the FIG. 2) similar to pre-driver 106 illustrated in FIG. 1. The main-driver 212 also receives a first bias voltage (Vp) and a second bias voltage (Vn) from a reference voltage generator (not illustrated in the FIG. 2) similar to reference voltage generator 118 in FIG. 1. A gate terminal of the first PMOS transistor P1 receives the first input voltage (PC) 208 and a gate terminal of the first NMOS transistor N1 receives the second input voltage (NC) 210. A gate terminal of the second PMOS transistor P2 receives the first bias voltage (Vp) and a gate terminal of the second NMOS transistor N2 receives the second bias voltage (Vn). A source terminal of the first PMOS transistor P1 receives a supply voltage VDDS. A drain terminal of the first PMOS transistor P1 and a source terminal of the second PMOS transistor P2 are coupled at node AN. A drain terminal of the first NMOS transistor N1 and a source terminal of the second NMOS transistor N2 are coupled at node BN. A source terminal of the first NMOS transistor N1 is coupled to a ground voltage 216. A drain terminal of the second PMOS transistor P2 and a drain terminal of the second NMOS transistor N2 are coupled to have a common node CN thereof coupled to the resistor Ro. The pad 214 is coupled to the resistor Ro. A first parasitic capacitor Cp and a second parasitic capacitor Cn represent the parasitic capacitance of the second PMOS transistor P2 and the second NMOS transistor N2 respectively. The parasitic capacitances are shown with capacitors Cp and Cn merely for illustration, even though no physical capacitor is present as parasitic capacitance. A receiver circuit (not illustrated in FIG. 2) is coupled to the pad 214 and the main-driver 212. The receiver circuit has not been shown in FIG. 2 and also not described herein for sake of brevity of description.

The operation of the IO circuit 200 illustrated in FIG. 2 is explained now. The first PMOS transistor P1 and the first NMOS transistor N1 together operate as an inverter. The second PMOS transistor P2 protects the first PMOS transistor P1. The second PMOS transistor P2 receives the first bias voltage (Vp) and does not allow a voltage at node AN to fall below (Vp+Vtp), where Vtp is a threshold voltage across the second PMOS transistor P2. Thus, a voltage drop across the drain terminal and source terminal of the first PMOS transistor P1 does not exceed a given voltage specification even if the pad 214 is at logic-LOW. Similarly, the second NMOS transistor N2 protects the first NMOS transistor N1. The second NMOS transistor N2 receives the second bias voltage (Vn) and does not allow a voltage at the node BN to rise above (Vn−Vtn), where Vtn is a threshold voltage across the second NMOS transistor N2. Thus, a voltage drop across the drain terminal and the source terminal of the first NMOS transistor N1 does not exceed a given voltage specification even if the pad 214 is at logic-HIGH. The main-driver 212 drive an output signal on the pad 214 to an external device. The first parasitic capacitor Cp and the second parasitic capacitor Cn represent the parasitic capacitance of the second PMOS transistor P2 and the second NMOS transistor N2 respectively. These first parasitic capacitor Cp and the second parasitic capacitor Cn couple transitions at pad 214 to the first bias voltage (Vp) and the second bias voltage (Vn) respectively. The parasitic capacitances are often large, as the size of the second PMOS transistor P2 and the second NMOS transistor N2 is large for fast switching. This voltage level change in the first bias voltage (Vp) and second bias voltage (Vn) adversely impacts the slew rate and hence the performance of the IO circuit 200.

Figure 3:
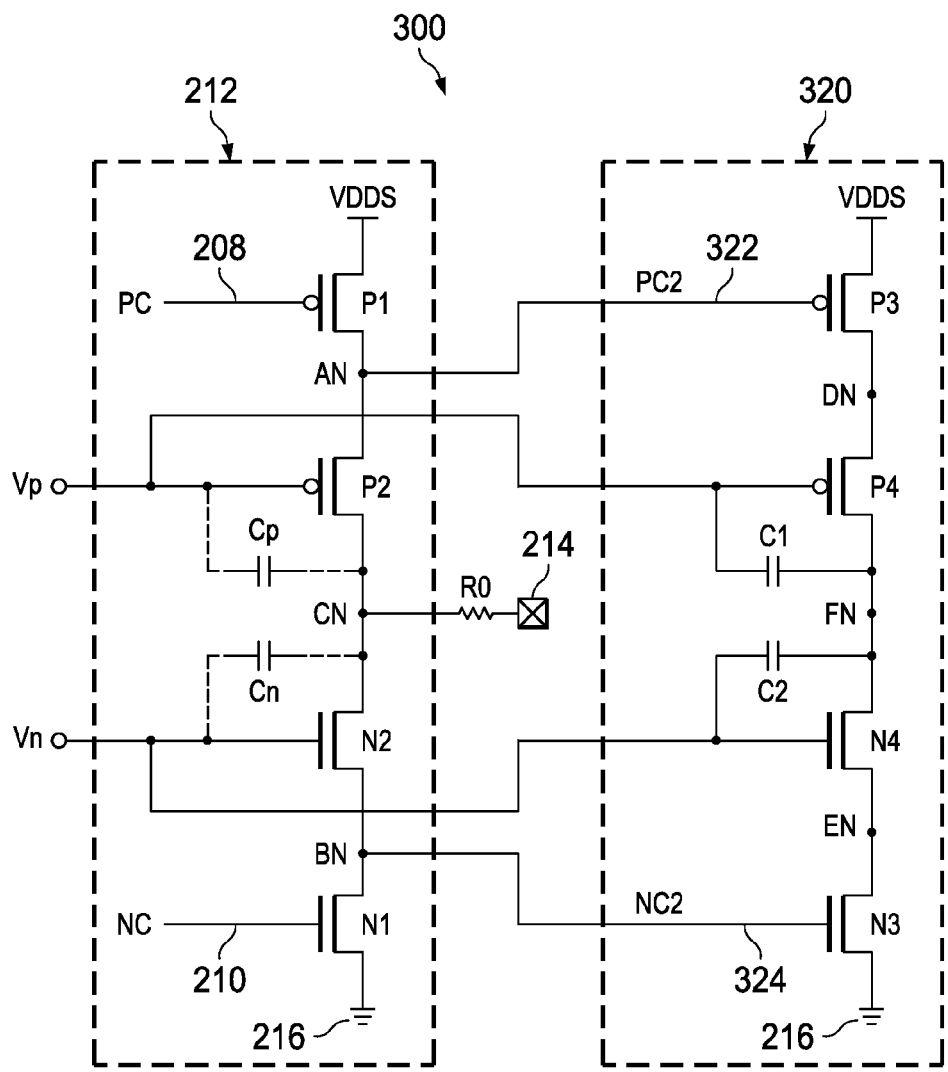
FIG. 3 illustrates a circuit schematic of an input/output (IO) circuit.

FIG. 3 illustrates a circuit schematic of an input/output (IO) circuit 300. Those components of FIG. 3, which have identical reference numerals or notations as those of FIG. 2 have same or similar functionalities and are therefore not explained again for brevity reasons. The IO circuit 300 includes a main-driver 212, a resistor Ro, a pad 214 and a post-reverse switch 320. The connection and operation of the main-driver 212, the resistor Ro, and the pad 214 have been explained in the description of FIG. 2 and are not repeated for the sake of simplicity. The post-reverse switch 320 is coupled to the main-driver 212. The post-reverse switch 320 receives a third output voltage (PC2) 322 and a fourth output voltage (NC2) 324 from the main-driver 212. The post-reverse switch 320 also receives a first bias voltage (Vp) and a second bias voltage (Vn) from a reference voltage generator (not illustrated in the FIG. 3) similar to reference voltage generator 118 in FIG. 1. The post-reverse switch 320 includes a third PMOS transistor P3, a fourth PMOS transistor P4, a third NMOS transistor N3 and a fourth NMOS transistor N4. A gate terminal of the third PMOS transistor P3 is coupled to node AN and receives the third output voltage (PC2) 322. A gate terminal of the third NMOS transistor N3 is coupled to node BN and receives the fourth output voltage (NC2) 324. A gate terminal of the fourth PMOS transistor P4 receives the first bias voltage (Vp) and a gate terminal of the fourth NMOS transistor N4 receives the second bias voltage (Vn). A source terminal of the third PMOS transistor P3 receives a supply voltage VDDS. A drain terminal of the third PMOS transistor P3 and a source terminal of the fourth PMOS transistor P4 are coupled at node DN. A drain terminal of the third NMOS transistor N3 and a source terminal of the fourth NMOS transistor N4 are coupled at node EN. A source terminal of the third NMOS transistor N3 is coupled to a ground voltage 216. A drain terminal of the fourth PMOS transistor P4 and a drain terminal of the fourth NMOS transistor N4 are coupled to have a common node FN. A first capacitor C1 is coupled between the gate terminal and the drain terminal of the fourth PMOS transistor P4 and a second capacitor C2 is coupled between the gate terminal and the drain terminal of the fourth NMOS transistor N4.

The operation of the IO circuit 300 illustrated in FIG. 3 is explained now. The third PMOS transistor P3 and the third NMOS transistor N3 together operate as an inverter similar to the first PMOS transistor P1 and the first NMOS transistor N1. The fourth PMOS transistor P4 protects the third PMOS transistor P3 from exposure to high voltages of the order of VDDS similar to second PMOS transistor P2. The fourth NMOS transistor N4 protects the third NMOS transistor N3 from exposure to high voltages similar to second NMOS transistor N2 as explained earlier. A voltage at the node AN swings with a voltage level between VDDS and (Vp+Vtp), where Vtp is a threshold voltage across the second PMOS transistor P2. A voltage at the node BN swings with a voltage level between (Vn−Vtn) and ground voltage 216, where Vtn is a threshold voltage across the second NMOS transistor N2. A voltage at the pad 214 swings with a voltage level between VDDS and ground voltage 216. It is noted that the voltage swing at the pad 214 is more than the voltage swing at the nodes AN and BN. Thus, the third PMOS transistor P3 coupled to node AN and the third NMOS transistor N3 coupled to node BN, are not exposed to high voltage of the order of VDDS. Even though, voltage swings at nodes AN, BN and voltage swing at the pad 214 are different, the voltages represent the same logic value. For example, when the first input voltage (PC) 208 and the second input voltage (NC) 210 are at logic-LOW, the voltage at node AN is at logic-HIGH (VDDS) and the voltage at the node BN is at logic-HIGH (Vn−Vtn). The voltage at the pad 214 is at logic-HIGH (VDDS). In another example, when the first input voltage (PC) 208 and the second input voltage (NC) 210 are at logic-HIGH, the voltage at node AN is at logic-LOW (Vp−Vtp) and the voltage at the node BN is at logic-LOW (ground voltage 216). The voltage at the pad 214 is at logic-LOW (ground voltage 216). Thus, the third PMOS transistor P3 and the third NMOS transistor N3 receive the same logic as the logic at the pad 214

The post-reverse switch 320 receives the third output voltage (PC2) 322 and a fourth output voltage (NC2)324 and generates a post-reverse switch output voltage at node FN. The post-reverse switch 320 is an inverter similar to main-driver 212. Thus, the post-reverse switch 320 operates as an inverter on the third output voltage (PC2) 322 and a fourth output voltage (NC2)324 and generates an inverted signal at node FN. Thus, a voltage generated at node FN is inverse of a voltage at the pad 214. For example, if the voltage at the pad 214 transitions from logic-HIGH to logic-LOW, the post-reverse switch output voltage at node FN transitions from logic-LOW to logic-HIGH.

The first parasitic capacitor Cp and the second parasitic capacitor Cn couple the transitions at the pad 214 to the first bias voltage (Vp) and the second bias voltage (Vn). The first capacitor C1 and the second capacitor C2 counter a coupling effect by the first parasitic capacitor Cp and the second parasitic capacitor Cn respectively. When the voltage at the pad 214 transitions from logic-LOW to logic-HIGH, the voltage at node FN switches from logic-HIGH to logic-LOW. The first parasitic capacitor Cp and the second parasitic capacitor Cn couple the voltage at pad 214 (logic-HIGH) to the first bias voltage (Vp) and the second bias voltage (Vn) respectively. Thus, the bias voltages are pulled-up by the parasitic capacitors Cp and Cn. However, the capacitors C1 and C2 pull-down the bias voltage to their previous level. The first capacitor C1 and the second capacitor C2 couple the voltage at the node FN (logic-LOW) to the first bias voltage (Vp) and the second bias voltage (Vn) respectively. Thus, the first bias voltage (Vp) and the second bias voltage (Vn) are pulled-down by the first capacitor C1 and the second capacitor C2 respectively. As a result, the bias voltages Vp and Vn remain substantially constant since the first capacitor C1 and the second capacitor C2 counter the coupling effect of the parasitic capacitors Cp and Cn. However, in a situation when a delay between the main-driver 212 and the post-reverse switch 320 is more, the voltage at the pad 214 pulls-up the bias voltage Vp and Vn beyond a voltage specification of the transistors. This can potentially damage the IO circuit 300. If the size of the first capacitor C1 and the second capacitor C2 is increased, it results in a higher area of IO circuit 300, which is undesirable.

Figure 4:
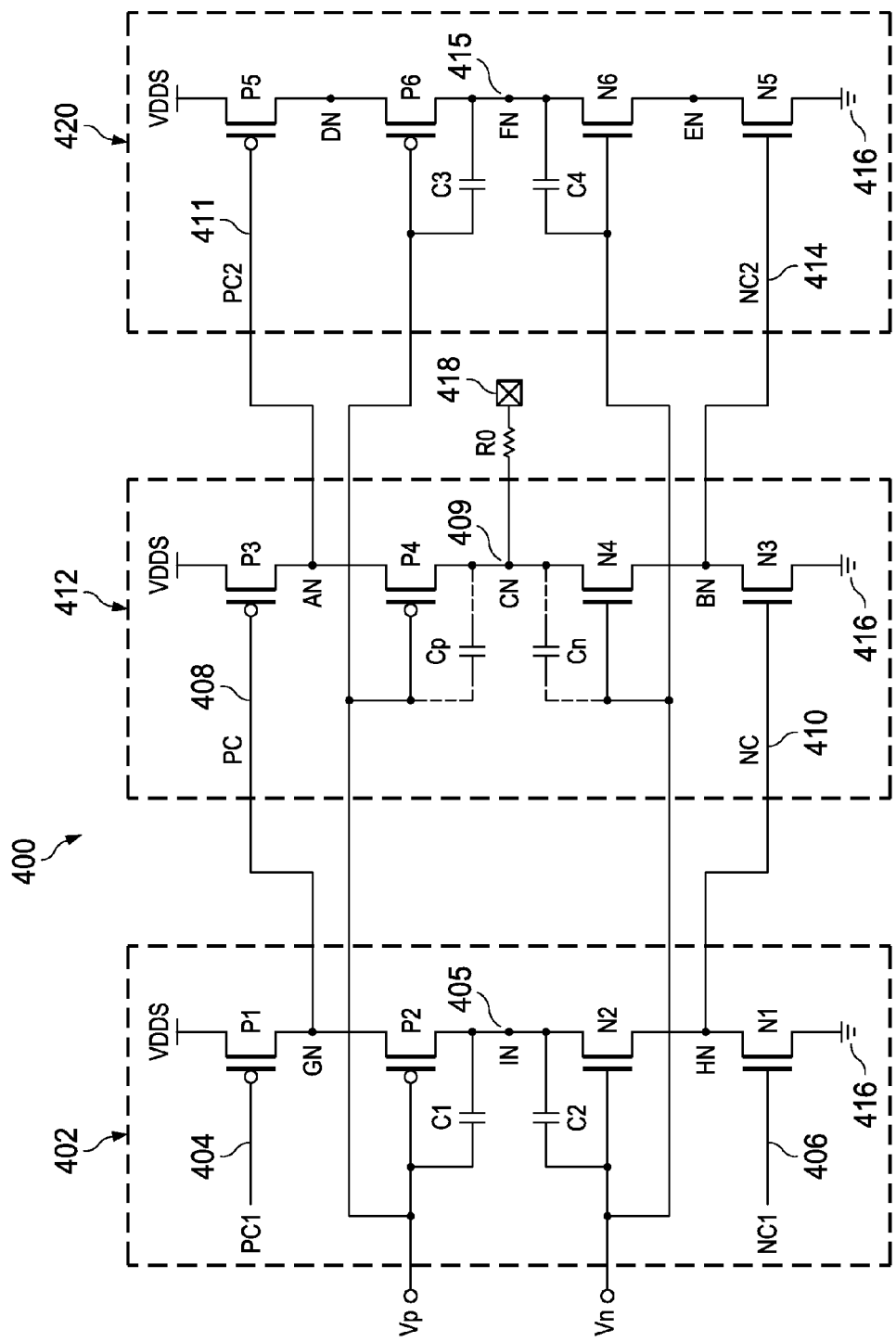
FIG. 4 illustrates a circuit schematic of an input/output (IO) circuit, according to an embodiment.

FIG. 4 illustrates a circuit schematic of an input/output (IO) circuit 400, according to an embodiment. The IO circuit 400 is a circuit schematic of the block diagram of the IO circuit 120 illustrated in FIG. 1. The IO circuit 400 includes a pre-reverse switch 402, a main-driver 412, a resistor Ro, a pad 418 and a post-reverse switch 420. The main-driver 412 is coupled to the pre-reverse switch 402 and the pad 418. The post-reverse switch 420 is coupled to the main-driver 412. Each transistor in the pre-reverse switch 402, the main-driver 412 and the post-reverse switch 420 has a voltage tolerance less than a supply voltage VDDS.

The pre-reverse switch 402 receives a pair of input voltage which includes a first input voltage (PC1) 404 and a second input voltage (NC1) 406. A pre-driver (not illustrated in FIG. 4) similar to pre-driver 106 illustrated in FIG. 1 generates two outputs which are inverted to generate the first input voltage (PC1) 404 and the second input voltage (NC1) 406. The pre-reverse switch 402 also receives a first bias voltage (Vp) and a second bias voltage (Vn) from a reference voltage generator (not illustrated in the FIG. 3) similar to reference voltage generator 118 in FIG. 1. The pre-reverse switch 402 includes a first PMOS transistor P1, a second PMOS transistor P2, a first NMOS transistor N1 and a second NMOS transistor N2. A gate terminal of the first PMOS transistor P1 receives the first input voltage (PC1) 404. A gate terminal of the first NMOS transistor N1 receives the second input voltage (NC1) 406. A gate terminal of the second PMOS transistor P2 receives the first bias voltage (Vp) and a gate terminal of the second NMOS transistor N2 receives the second bias voltage (Vn). A source terminal of the first PMOS transistor P1 receives the supply voltage VDDS. A drain terminal of the first PMOS transistor P1 and a source terminal of the second PMOS transistor P2 are coupled at a common node GN. A drain terminal of the first NMOS transistor N1 and a source terminal of the second NMOS transistor N2 are coupled at a common node HN. A source terminal of the first NMOS transistor N1 is coupled to a ground voltage 416. A drain terminal of the second PMOS transistor P2 and a drain terminal of the second NMOS transistor N2 are coupled to have a common node IN. A first capacitor C1 is coupled between the gate terminal and the drain terminal of the second PMOS transistor P2 and a second capacitor C2 is coupled between the gate terminal and the drain terminal of the second NMOS transistor N2. The pre-reverse switch 402 generates a first output voltage (PC) 408 at the common node GN and a second output voltage (NC) 410 at the common node HN. Also, the pre-reverse switch 402 generates a pre-reverse switch output voltage 405 at the common node IN.

The main-driver 412 includes a third PMOS transistor P3, a fourth PMOS transistor P4, a third NMOS transistor N3 and a fourth NMOS transistor N4. The main-driver 412 receives the first output voltage (PC) 408 and a second output voltage (NC) 410 from the pre-reverse switch 402. The main-driver 412 also receives the first bias voltage (Vp) and the second bias voltage (Vn). A gate terminal of the third PMOS transistor P3 is coupled to the common node GN and receives the first output voltage (PC) 408 and a gate terminal of the third NMOS transistor N3 receives the second output voltage (NC) 410. A gate terminal of the fourth PMOS transistor P4 receives the first bias voltage (Vp) and a gate terminal of the fourth NMOS transistor N4 receives the second bias voltage (Vn). A source terminal of the third PMOS transistor P3 receives a supply voltage VDDS. A drain terminal of the third PMOS transistor P3 and a source terminal of the fourth PMOS transistor P4 are coupled at common node AN. A drain terminal of the third NMOS transistor N3 and a source terminal of the fourth NMOS transistor N4 are coupled at common node BN. A source terminal of the third NMOS transistor N3 is coupled to a ground voltage 416. A drain terminal of the fourth PMOS transistor P4 and a drain terminal of the fourth NMOS transistor N4 are coupled to have a common node CN thereof coupled to the resistor Ro. The pad 418 is coupled to the resistor Ro. A first parasitic capacitor Cp and a second parasitic capacitor Cn represent the parasitic capacitance of the fourth PMOS transistor P4 and the fourth NMOS transistor N4 respectively. The parasitic capacitances are shown with capacitors Cp and Cn merely for illustration, even though no physical capacitor is present as parasitic capacitance. A receiver circuit (not illustrated in FIG. 4) is coupled to the pad 418 and the main-driver 412. The receiver circuit has not been shown in FIG. 4 and also not described herein for sake of brevity of description. The main-driver 412 generates a third output voltage (PC2) 411 at the common node AN and a fourth output voltage (NC2) 414 at the common node BN. Also, the main-driver 412 generates a main-driver output voltage 409 at the common node CN. The pad 418 receives the main-driver output voltage 409. The main-driver output voltage 409 is an output voltage of the IO circuit 400 that is according to a voltage specification of an external device.

The post-reverse switch 420 is coupled to the main-driver 412. The post-reverse switch 420 receives a third output voltage (PC2) 411 and a fourth output voltage (NC2) 414 from the main-driver 412. The post-reverse switch 420 also receives the first bias voltage (Vp) and the second bias voltage (Vn). The post-reverse switch 420 includes a fifth PMOS transistor P5, a sixth PMOS transistor P6, a fifth NMOS transistor N5 and a sixth NMOS transistor N6. A gate terminal of the fifth PMOS transistor P5 is coupled to common node AN and receives the third output voltage (PC2) 411. A gate terminal of the fifth NMOS transistor N5 is coupled to common node BN and receives the fourth output voltage (NC2) 414. A gate terminal of the sixth PMOS transistor P6 receives the first bias voltage (Vp) and a gate terminal of the sixth NMOS transistor N6 receives the second bias voltage (Vn). A source terminal of the fifth PMOS transistor P5 receives a supply voltage VDDS. A drain terminal of the fifth PMOS transistor P5 and a source terminal of the sixth PMOS transistor P6 are coupled at a common node DN. A drain terminal of the fifth NMOS transistor N5 and a source terminal of the sixth NMOS transistor N6 are coupled at a common node EN. A source terminal of the fifth NMOS transistor N5 is coupled to a ground voltage 416. A drain terminal of the sixth PMOS transistor P6 and a drain terminal of the sixth NMOS transistor N6 are coupled to have a common node FN. A third capacitor C3 is coupled between the gate terminal and the drain terminal of the sixth PMOS transistor P6 and a fourth capacitor C4 is coupled between the gate terminal and the drain terminal of the sixth NMOS transistor N6. The post-reverse switch 420 generates a post-reverse switch output voltage 415 at the common node FN.

The operation of the main-driver 412, pre-reverse switch 402 and the post-reverse switch 420 are explained individually first followed by operation of the IO circuit 400.

The operation of the main-driver 412 illustrated in FIG. 4 is explained now. The third PMOS transistor P3 and the third NMOS transistor N3 together operate as an inverter. The fourth PMOS transistor P4 protects the third PMOS transistor P3. The fourth PMOS transistor P4 receives the first bias voltage (Vp) and does not allow a voltage at common node AN to fall below (Vp+Vtp), where Vtp is a threshold voltage across the fourth PMOS transistor P4. Thus, a voltage drop across the drain terminal and source terminal of the third PMOS transistor P3 does not exceed a given voltage specification even if the pad 418 is at logic-LOW. Similarly, the fourth NMOS transistor N4 protects the third NMOS transistor N3. The fourth NMOS transistor N4 receives the second bias voltage (Vn) and does not allow a voltage at the common node BN to rise above (Vn−Vtn), where Vtn is a threshold voltage across the fourth NMOS transistor N4. Thus, a voltage drop across the drain terminal and the source terminal of the third NMOS transistor N3 does not exceed a given voltage specification even if the pad 418 is at logic-HIGH. The main-driver 412 drive a main-driver output voltage 409 on the pad 418 to an external device. The main-driver output voltage 409 has a voltage swing equaling the supply voltage VDDS. The first parasitic capacitor Cp and second parasitic capacitor Cn represent the parasitic capacitance of the fourth PMOS transistor P4 and the fourth NMOS transistor N4 respectively. These parasitic capacitors Cp and Cn couple voltage transitions at pad 418 to the first bias voltage (Vp) and the second bias voltage (Vn) respectively. The parasitic capacitances are often large, as the size of the fourth PMOS transistor P4 and the fourth NMOS transistor N4 is large for fast switching.

A voltage at the common node AN swings with a voltage level between VDDS and (Vp+Vtp) and a voltage at the common node BN swings with a voltage level between (Vn−Vtn) and ground voltage 416. A voltage at the pad 418 swings with a voltage level between VDDS and ground voltage 416. It is noted that the voltage swing at the pad 418 is more than the voltage swing at the common nodes AN and BN. Thus, the fifth PMOS transistor P5 coupled to common node AN and the fifth NMOS transistor N5 coupled to common node BN, are not exposed to voltages above a defined specification. Even though, the voltage swings at common nodes AN, BN and the voltage swing at the pad 418 are different, the voltages represent the same logic value. For example, when the first output voltage (PC) 408 and the second output voltage (NC) 410 are at logic-LOW, the voltage at common node AN is at logic-HIGH (VDDS) and the voltage at the common node BN is at logic-HIGH (Vn−Vtn). The voltage at the pad 418 is at logic-HIGH (VDDS). In another example, when the first output voltage (PC) 408 and the second output voltage (NC) 410 are at logic-HIGH, the voltage at common node AN is at logic-LOW (Vp−Vtp) and the voltage at the common node BN is at logic-LOW (ground voltage 416). The voltage at the pad 418 is at logic-LOW (ground voltage 416). Thus, the fifth PMOS transistor P5 and the fifth NMOS transistor N5 receive the same logic as the logic at the pad 418. The third output voltage (PC2) 411 is inverse of the first output voltage (PC) 408 and the fourth output voltage (NC2) 414 is inverse of the second output voltage (NC) 410.

The operation of the pre-reverse switch 402 illustrated in FIG. 4 is explained now. The first PMOS transistor P1 and the first NMOS transistor N1 together operate as an inverter similar to the third PMOS transistor P3 and the third NMOS transistor N3 in the main-driver 412. The second PMOS transistor P2 protects the first PMOS transistor P1 from exposure to high voltages of the order of VDDS similar to fourth PMOS transistor P4. The second NMOS transistor N2 protects the first NMOS transistor N1 from exposure to high voltages similar to fourth NMOS transistor N4 as explained earlier. A voltage at the common node GN swings with a voltage level between VDDS and (Vp+Vtp), where Vtp is a threshold voltage across the second PMOS transistor P2. A voltage at the common node HN swings with a voltage level between (Vn−Vtn) and ground voltage 416, where Vtn is a threshold voltage across the second NMOS transistor N2. The pre-reverse switch output voltage 405 generated at the common node IN swings with a voltage level between VDDS and ground voltage 416. It is noted that the voltage swing at the common node IN is more than the voltage swing at the common nodes GN and HN. Thus, the third PMOS transistor P3 coupled to common node GN and the third NMOS transistor N3 coupled to common node HN, are not exposed to voltages above a defined specification. Even though, voltage swings at common nodes GN, HN and IN are different, the voltages represent the same logic value. For example, when the first input voltage (PC1) 404 and the second input voltage (NC1) 406 are at logic-LOW, the voltage at common node GN is at logic-HIGH (VDDS) and the voltage at the common node HN is at logic-HIGH (Vn−Vtn). The voltage at the common node IN is at logic-HIGH (VDDS). In another example, when the first input voltage (PC1) 404 and the second input voltage (NC1) 406 are at logic-HIGH, the voltage at common node GN is at logic-LOW (Vp−Vtp) and the voltage at the common node HN is at logic-LOW (ground voltage 416). The voltage at the common node IN is at logic-LOW (ground voltage 416). Thus, the third PMOS transistor P3 and the third NMOS transistor N3 receive the same logic as the logic at the common node IN or the logic of the pre-reverse switch output voltage 405. The first input voltage (PC1) 404 and the second input voltage (NC1) 406 have a voltage swing less than the supply voltage VDDS. Also, the first output voltage (PC) 408 is inverse of the first input voltage (PC1) 404 i.e. when the first input voltage (PC1) 404 transitions from logic-LOW to logic-HIGH, the first output voltage (PC) 408 transitions from logic-HIGH to logic-LOW. Similarly, the second output voltage (NC) 410 is inverse of the second input voltage (NC1) 406.

The pre-reverse switch 402 receives the first input voltage (PC1) 404 and the second input voltage (NC1) 406 and generates a pre-reverse switch output voltage 405 at common node IN. The pre-reverse switch 402 is basically an inverter similar to main-driver 412. Thus, the pre-reverse switch 402 operates as an inverter on the first input voltage (PC1) 404 and the second input voltage (NC1) 406 and generates an inverted signal at the common node IN. Thus, a voltage generated at common node IN is inverse of the logic at the pad 418. For example, if the pad 418 transitions from logic-HIGH to logic-LOW, the pre-reverse switch output voltage 405 at the common node IN transitions from logic-LOW to logic-HIGH. The first capacitor C1 couples the pre-reverse switch output voltage 405 to the first bias voltage Vp and the second capacitor C2 couples the pre-reverse switch output voltage 405 to the second bias voltage Vn.

The operation of the post-reverse switch 420 illustrated in FIG. 4 is explained now. The fifth PMOS transistor P5 and the fifth NMOS transistor N5 together operate as an inverter similar to the third PMOS transistor P3 and the third NMOS transistor N3. The sixth PMOS transistor P6 protects the fifth PMOS transistor P5 from exposure to high voltages of the order of VDDS similar to fourth PMOS transistor P4. The sixth NMOS transistor N6 protects the fifth NMOS transistor N5 from exposure to high voltages similar to fourth NMOS transistor N4 as explained earlier. A voltage at the common node DN swings with a voltage level between VDDS and (Vp+Vtp), where Vtp is a threshold voltage across the sixth PMOS transistor P6. A voltage at the common node EN swings with a voltage level between (Vn−Vtn) and ground voltage 416, where Vtn is a threshold voltage across the sixth NMOS transistor N6. A voltage at the common node FN swings with a voltage level between VDDS and ground voltage 416. It is noted that the voltage swing at the common node FN is more than the voltage swing at the common nodes DN and EN. Even though, voltage swings at common nodes DN, EN and voltage swing at the common node FN are different, the voltages represent the same logic value. For example, when the third output voltage (PC2) 411 and the fourth output voltage (NC2) 414 are at logic-LOW, the voltage at common node DN is at logic-HIGH (VDDS) and the voltage at the common node EN is at logic-HIGH (Vn−Vtn). The voltage at the common node FN is at logic-HIGH (VDDS). In another example, when the third output voltage (PC2) 411 and the second output voltage (NC2) 414 are at logic-HIGH, the voltage at common node DN is at logic-LOW (Vp−Vtp) and the voltage at the common node EN is at logic-LOW (ground voltage 416). The voltage at the common node FN is at logic-LOW (ground voltage 416). The fifth PMOS transistor P5 and the fifth NMOS transistor N5 receive the same logic as the logic at the pad 418.

The post-reverse switch 420 receives the third output voltage (PC2) 411 and a fourth output voltage (NC2) 414 and generates a post-reverse switch output voltage 415 at common node FN. The post-reverse switch 420 is basically an inverter similar to main-driver 412. Thus, the post-reverse switch 420 operates as an inverter on the third output voltage (PC2) 411 and a fourth output voltage (NC2) 414 and generates an inverted signal at the common node FN. Thus, a voltage generated at common node FN is inverse of the logic at the pad 418. For example, if the pad 418 transitions from logic-HIGH to logic-LOW, the post-reverse switch output voltage 415 at the common node FN transitions from logic-LOW to logic-HIGH. The third capacitor C3 couples the post-reverse switch output voltage 415 to the first bias voltage Vp and the fourth capacitor C4 couples the post-reverse switch output voltage 415 to the second bias voltage Vn.

The first parasitic capacitors Cp and the second parasitic capacitor Cn couple the voltage transitions at the pad 418 to the first bias voltage (Vp) and the second bias voltage (Vn) respectively. The first capacitor C1, the second capacitor C2, the third capacitor C3 and the fourth capacitor C4 counter a coupling effect by the parasitic capacitors Cp and Cn. More particularly, the first capacitor C1 and the third capacitor C3 counter the effect of coupling by the first parasitic capacitance Cp on the first bias voltage Vp and the second capacitor C2 and the fourth capacitor C4 counter the effect of coupling by the second parasitic capacitance Cn on the second bias voltage Vn. This is further described in detail in the following paragraphs.

During idle mode i.e. when there is no transition in the first input voltage (PC1) 404 and the second input voltage (NC1) 406, the first bias voltage Vp and the second bias voltage Vn are at voltage levels defined by reference voltage generator. When there is a state change or logic transition (logic-LOW to logic-HIGH or vice versa) in the first input voltage (PC1) 404 and the second input voltage (NC1) 406, the pre-reverse switch output voltage 405 makes a logic transition. The main-driver output voltage 409 makes a logic transition when an output of the pre-reverse switch 402 is received at the main-driver 412. Thereafter, the post-reverse switch output voltage 415 makes a logic transition when an output of the main-driver 412 is received at the post-reverse switch 420.

When the first input voltage (PC1) 404 and the second input voltage (NC1) 406 transitions from logic-LOW to logic-HIGH, the first capacitor C1 couples the pre-reverse switch output voltage 405 to the first bias voltage Vp and hence pulls-up the first bias voltage by a first predefined voltage level. The first parasitic capacitor Cp couple voltage transition at pad 418 to the first bias voltage Vp and hence pulls-down the first bias voltage Vp by a second predefined voltage level. The coupling by the third capacitor C3 couples the post-reverse switch output voltage 415 to the first bias voltage Vp and hence pulls-up the first bias voltage Vp by a third predefined voltage level. The second predefined voltage level is equal to the sum of the first predefined voltage level and the third predefined voltage level such that the coupling effect of the first parasitic capacitor Cp on the first bias voltage is cancelled by the coupling of the first capacitor C1 and the coupling of the third capacitor C3 on the first bias voltage Vp. As a result, the bias voltage Vp remains substantially constant since the first capacitor C1 and the third capacitor C3 counter the coupling effect of the parasitic capacitor Cp. It is understood that when the first input voltage (PC1) 404 and the second input voltage (NC1) 406, transitions from logic-HIGH to logic-LOW, the coupling by the first parasitic capacitor Cp will pull-up the first bias voltage Vp by a voltage level and the first capacitor C1 and the third capacitor C3 will pull-down the first bias voltage Vp by the same voltage level such that the first bias voltage Vp remains substantially constant.

When the first input voltage (PC1) 404 and the second input voltage (NC1) 406 transitions from logic-LOW to logic-HIGH, the second capacitor C2 couples the pre-reverse switch output voltage 405 to the second bias voltage Vn and hence pulls-up the second bias voltage Vn by a fourth predefined voltage level. The second parasitic capacitor Cn couple voltage transitions at pad 418 to the second bias voltage (Vn) and hence pulls-down the second bias voltage Vn by a fifth predefined voltage level. The fourth capacitor C4 couples the post-reverse switch output voltage 415 to the second bias voltage Vn and hence pulls-up the second bias voltage Vn by a sixth predefined voltage level. The fifth predefined voltage level is equal to the sum of the fourth predefined voltage level and the sixth predefined voltage level such that the coupling effect by the second parasitic capacitor Cn on the second bias voltage Vn is cancelled by the second capacitor C2 and the fourth capacitor C4. As a result, the bias voltage Vn remains substantially constant since the second capacitor C2 and the fourth capacitor C4 counter the coupling effect of the parasitic capacitor Cn. It is understood that when the first input voltage (PC1) 404 and the second input voltage (NC1) 406 transitions from logic-HIGH to logic-LOW, the coupling by the second parasitic capacitor Cn will pull-up the second bias voltage Vn by a voltage level and the second capacitor C2 and the fourth capacitor C4 will pull-down the second bias voltage Vn by the same voltage level such that the second bias voltage Vn remains substantially constant.

In an embodiment, the capacitance of the first capacitor C1 and the capacitance of the third capacitor C3 are less than the first parasitic capacitance of the fourth PMOS transistor P4 and the capacitance of the second capacitor C2 and the capacitance of the fourth capacitor C4 are less than the parasitic capacitance of the fourth NMOS transistor N4. In an embodiment, the capacitance of each of the first capacitor C1 and the third capacitor C3 is equal to half the capacitance of the first parasitic capacitor Cp. In another embodiment, the capacitance of each of the second capacitor C2 and the fourth capacitor C4 is equal to half the capacitance of the second parasitic capacitor Cn. Thus, the size of capacitors used in IO circuit 400 is less than the size of capacitors used in IO circuit 300. Also, since the first bias voltage Vp and the second bias voltage Vn are limited to lesser variation about their static levels, the jitter in the main-driver output voltage 409 is reduced.

The IO circuit 400 is a high voltage IO circuit and is implemented with low voltage devices i.e. each transistor in the pre-reverse switch 402 and the post-reverse switch 420 has a voltage tolerance less than a supply voltage VDDS. The size of the transistors in the pre-reverse switch 402 and the post-reverse switch 420 are smaller than the size of the transistors used in main-driver 412 as the pre-reverse switch 402 and the post-reverse switch 420 does not drive any external load. Therefore, the area requirement of the IO circuit is also reduced. Also, a transition time of the IO circuit 400 is improved thus improving a signal quality of the main-driver output voltage 409 driven on pad 418. In a case when the first input voltage (PC1) 404 and the second input voltage (NC1) 406 transitions from logic-LOW to logic-HIGH, the coupling by the first capacitor C1 pulls-down the first bias voltage Vp and the second capacitor C2 pulls-down the second bias voltage Vn. Thus, a voltage level of bias voltages received at the main-driver 412 is less than the first bias voltage Vp and the second bias voltage Vn. This will increase a switching rate of the main-driver output voltage 409 i.e. a rise transition in the main-driver output voltage 409 will be faster. Also, when the first input voltage (PC1) 404 and the second input voltage (NC1) 406 transitions from logic-HIGH to logic-LOW, the coupling by the first capacitor C1 pulls-up the first bias voltage Vp and the second capacitor C2 pulls-up the second bias voltage Vn. Thus, a voltage level of bias voltages received at the main-driver 412 is more than the first bias voltage Vp and the second bias voltage Vn. This will increase a switching rate of the main-driver output voltage 409 i.e. a fall transition in the main-driver output voltage 409 will be faster.

Figure 5:
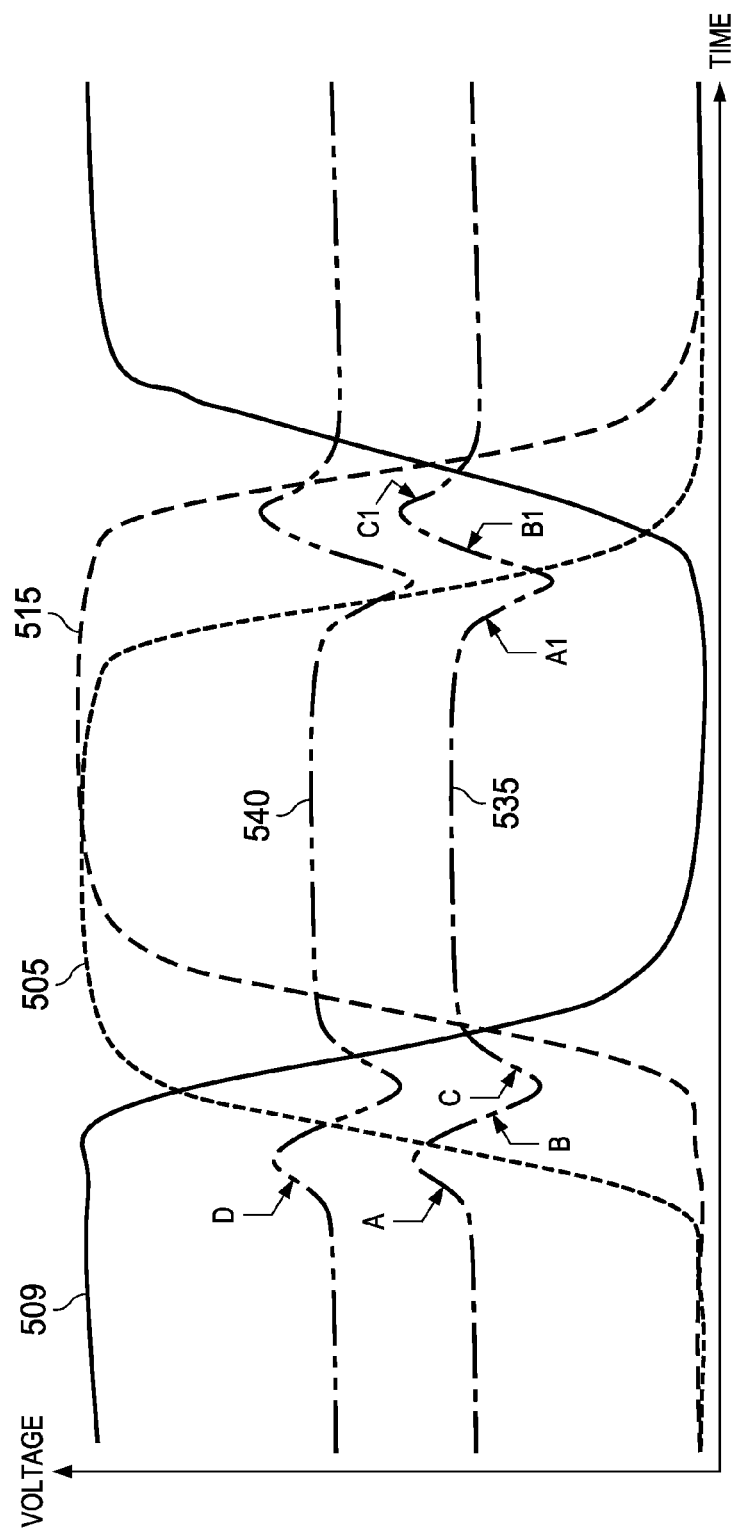
FIG. 5 is a timing diagram illustrating the details of coupling effect in the IO circuit illustrated in FIG. 4, according to an embodiment.

FIG. 5 is a timing diagram illustrating the details of coupling effect in the IO circuit 400, according to an embodiment. The lines 505, 509, 515, 535 and 540 represent the pre-reverse switch output voltage 405, main-driver output voltage 409, the post-reverse switch output voltage 415, the first bias voltage Vp and the second bias voltage Vn respectively. It is noted that the pre-reverse switch output voltage 405 (line 505) and the post-reverse switch output voltage 415 (line 515) are at the opposite logic as the main-driver output voltage 409 (line 509). When the pre-reverse switch output voltage 405 (line 505) transitions from logic-LOW to logic-HIGH, after some delay the main-driver output voltage 409 (line 509) transitions from logic-HIGH to logic-LOW. After some delay, the post-reverse switch output voltage 415 (line 515) transitions from logic-LOW to logic-HIGH. The bias voltage Vp and Vn (line 535 and line 540) are stable at a voltage level when the pre-reverse switch output voltage 405 (line 505) is stable. It is noted that when the pre-reverse switch output voltage 405 (line 505) transitions from logic-LOW to logic-HIGH, the first bias voltage Vp (line 535) is shown rising from the stable voltage level (shown as A). This rise represents the coupling effect of the first capacitor C1 which pulls-up the first bias voltage Vp. Similarly, the second bias voltage Vn (line 540) is shown rising from the stable voltage level (shown as D). This rise represents the coupling effect of the second capacitor C2 which pulls-up the second bias voltage Vn. For the sake of simplicity, the further description includes response of first bias voltage Vp and it is understood that a similar response is illustrated by the second bias voltage Vn.

When the main-driver output voltage 409 (line 509) transitions from logic-HIGH to logic-LOW, the first bias voltage Vp (line 535) is shown falling illustrated as B. This fall represents the coupling effect of the first parasitic capacitor Cp which pulls-down the first bias voltage Vp. When the post-reverse switch output voltage 415 (line 515) transitions from logic-LOW to logic-HIGH, the first bias voltage Vp (line 535) is shown rising illustrated as C. This rise represents the coupling effect of the third capacitor C3 which pulls-up the first bias voltage Vp. Thus, the coupling effect of the first parasitic capacitor Cp is cancelled by the first capacitor C1 and the third capacitor C3.

Similarly, when the pre-reverse switch output voltage 405 (line 505) transitions from logic-HIGH to logic-LOW, the first bias voltage Vp (line 535) is shown falling from the stable voltage level (shown as A1). This fall represents the coupling effect of the first capacitor C1 which pulls-down the first bias voltage Vp. When the main-driver output voltage 409 (line 509) transitions from logic-LOW to logic-HIGH, the first bias voltage Vp (line 535) is shown rising illustrated as B1. This rise represents the coupling effect of the first parasitic capacitor Cp which pulls-up the first bias voltage Vp. When the post-reverse switch output voltage 415 (line 515) transitions from logic-HIGH to logic-LOW, the first bias voltage Vp (line 535) is shown falling illustrated as C1. This fall represents the coupling effect of the third capacitor C3 which pulls-down the first bias voltage Vp. Thus, the coupling effect of the first parasitic capacitor Cp is cancelled by the first capacitor C1 and the third capacitor C3.

Figure 6:
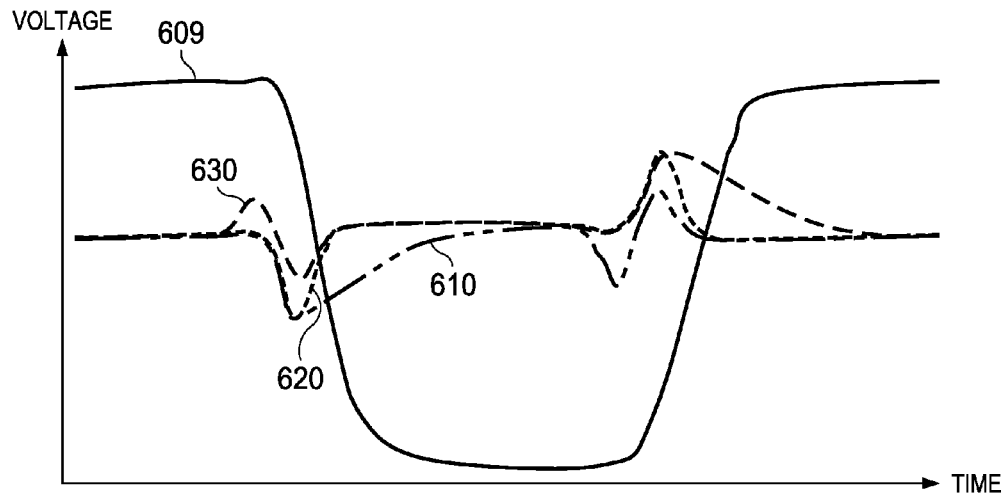
FIG. 6 is a timing diagram comparing the coupling effect in the IO circuits, according to an embodiment.

FIG. 6 is a timing diagram comparing the coupling effect in the IO circuit 400, IO circuit 300 and IO circuit 200, according to an embodiment. The line 609 represent the main-driver output voltage (voltage at the pad of the IO circuit). The lines 610, 620 and 630 represents the response of the bias voltages (first bias voltage Vp or second bias voltage Vn) in the IO circuit 200, IO circuit 300 and IO circuit 400 respectively. It is noted that when the main-driver output voltage or the pad voltage is static, the bias voltage is at a stable voltage level. When the main-driver output voltage or the pad voltage transitions from logic-HIGH to logic-LOW, the bias voltage (line 610) in the IO circuit 200 falls because of the parasitic capacitors (Cp or Cn). In absence of any capacitor to couple the bias voltage (line 610), the bias voltage (line 610) takes a long duration to reach the stable voltage level. In IO circuit 300, when the main-driver output voltage or the pad voltage transitions from logic-HIGH to logic-LOW, the bias voltage (line 620) falls because of the parasitic capacitors (Cp or Cn). Because of the post-reverse switch in IO circuit 300, the coupling by the capacitor (the first capacitor or the second capacitor) pulls-up the bias voltage (line 620) to the stable voltage level. When a delay between the main-driver and the post-reverse switch is more, the voltage at the pad pulls-up the bias voltage (line 620) beyond a voltage specification of the transistors. This reduces the IO circuit 300 reliability and can potentially damage the IO circuit 300. If the size of the capacitor (first capacitor or the second capacitor) is increased, it results in a higher area of IO circuit 300, which is undesirable.

In IO circuit 400, when the main-driver output voltage or the pad voltage transitions from logic-HIGH to logic-LOW, the bias voltage (line 630) is shown rising from the stable voltage level because of the coupling effect of the capacitor in the pre-reverse switch which pulls-up the bias voltage (line 630). The bias voltage (line 630) then falls because of the coupling effect of the parasitic capacitor in the main-driver which pulls-down the bias voltage (line 630). Thereafter, the bias voltage (line 630) is shown rising because of the coupling effect of the capacitor in the post-reverse switch which pulls-up the bias voltage (line 630). Thus, in IO circuit 400, the bias voltages have limited drift from the stable voltage level.

Figure 7:
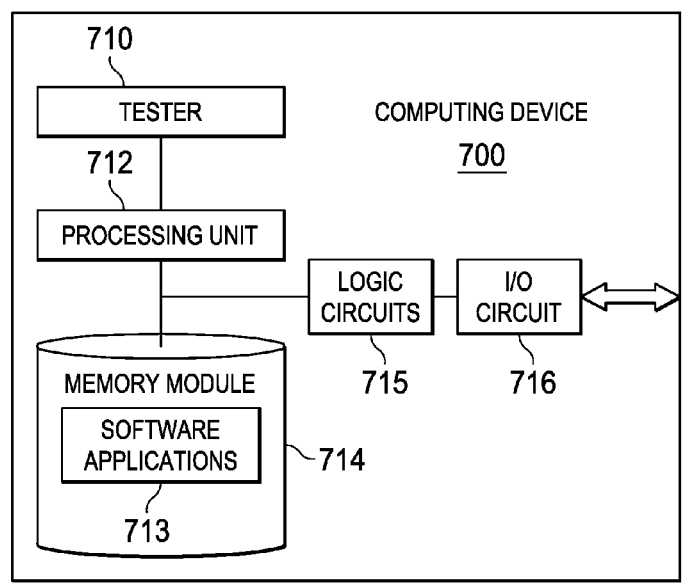
FIG. 7 illustrates a computing device, according to an embodiment.

FIG. 7 illustrates a computing device 700 according to an embodiment. The computing device 700 is, or is an integrated circuit incorporated into, a mobile communication device, such as a mobile phone, a personal digital assistant, a personal computer, or any other type of electronic system.

In some embodiments, the computing device 700 can be one of, but not limited to, microcontroller, microprocessor or a system-on-chip (SoC) which includes a processing unit 712 such as a CPU (Central Processing Unit), a memory module 714 (e.g., random access memory (RAM)) and a tester 710. The processing unit 712 can be, for example, a CISC-type (Complex Instruction Set Computer) CPU, RISC-type CPU (Reduced Instruction Set Computer), or a digital signal processor (DSP). The memory module 714 (which can be memory such as RAM, flash memory, or disk storage) stores one or more software application 713 (e.g., embedded applications) that, when executed by the processing unit 712, perform any suitable function associated with the computing device 700. The tester 710 comprises logic that supports testing and debugging of the computing device 700 executing the software application 713. For example, the tester 710 can be used to emulate a defective or unavailable component(s) of the computing device 700 to allow verification of how the component(s), were it actually present on the computing device 700, would perform in various situations (e.g., how the component(s) would interact with the software application 713). In this way, the software application 713 can be debugged in an environment which resembles post-production operation.

The processing unit 712 comprises a cache-memory and logic which store and use information frequently accessed from the memory module 714 and is responsible for the complete functionality of the computing device 700. The computing device 700 includes a plurality of logic circuits 715. At least one logic circuit of the plurality of logic circuits 715 is coupled to an IO circuit 716. The IO circuit 716 acts as an interface between the computing device 700 and the external world. The IO circuit 716 is analogous to the IO circuit 400 in connection and operation. The IO circuit 716 finds application in different devices especially devices working on high voltage signals and using low voltage devices. The IO circuit 716 reduces an effect of coupling on the bias voltages in input/output (IO) circuits.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "connected to" or "connected with" (and the like) are intended to describe either an indirect or direct electrical connection. Thus, if a first device is coupled to a second device, that connection can be through a direct electrical connection, or through an indirect electrical connection via other devices and connections. Further, the term "logic-HIGH" is generally intended to describe a signal that is at logic state "1," and the term "logic-LOW" is generally intended to describe a signal that is at logic state "0." Also, the terms "inactivation" or "inactivated" or turn "OFF" or turned "OFF" is used to describe a deactivation of a device, a component or a signal. The terms "activation" or "activated" or turned "ON" describes activation of a device, a component or a signal.

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Further, the described features, advantages, and characteristics of the disclosure may be combined in any suitable manner in one or more embodiments. One skilled in the relevant art will recognize that the disclosure can be practiced without one or more of the specific features or advantages of a particular embodiment. In other instances, additional features and advantages may be recognized in certain embodiments that may not be present in all embodiments of the disclosure.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. An input/output (IO) circuit comprising:
a pre-reverse switch configured to receive a pair of input voltages, the pre-reverse switch comprising a first capacitor and a second capacitor;
a main-driver, coupled to the pre-reverse switch and a pad, configured to receive a first bias voltage and a second bias voltage and configured to generate a main-driver output voltage, the main-driver having a first parasitic capacitance and a second parasitic capacitance, wherein the first parasitic capacitance is configured to couple the main-driver output voltage to the first bias voltage and the second parasitic capacitance is configured to couple the main-driver output voltage to the second bias voltage; and
a post-reverse switch coupled to the main-driver, the post-reverse switch comprising a third capacitor and a fourth capacitor, wherein the first capacitor and the third capacitor counter an effect of coupling by the first parasitic capacitance on the first bias voltage and the second capacitor and the fourth capacitor counter an effect of coupling by the second parasitic capacitance on the second bias voltage.

2. The IO circuit of claim 1, wherein the pair of input voltages comprises a first input voltage and a second input voltage and the pad is configured to receive the main-driver output voltage.

3. The IO circuit of claim 1, wherein:
the pre-reverse switch is configured to receive the first bias voltage and the second bias voltage and configured to generate a pre-reverse switch output voltage;
the first capacitor is configured to couple the pre-reverse switch output voltage to the first bias voltage and the second capacitor is configured to couple the pre-reverse switch output voltage to the second bias voltage;
the post-reverse switch is configured to receive the first bias voltage and the second bias voltage and configured to generate a post-reverse switch output voltage; and
the third capacitor is configured to couple the post-reverse switch output voltage to the first bias voltage and the fourth capacitor is configured to couple the post-reverse switch output voltage to the second bias voltage.

4. The IO circuit of claim 1, wherein when the first input voltage and the second input voltage transitions from logic-LOW to logic-HIGH:
the first capacitor pulls-up the first bias voltage by a first predefined voltage level;
the first parasitic capacitance pulls-down the first bias voltage by a second predefined voltage level; and
the third capacitor pulls-up the first bias voltage by a third predefined voltage level, wherein the second predefined voltage level is equal to a sum of the first predefined voltage level and the third predefined voltage level such that the effect of coupling by the first parasitic capacitance on the first bias voltage is cancelled.

5. The IO circuit of claim 1, wherein when the first input voltage and the second input voltage transitions from logic-LOW to logic-HIGH:
the second capacitor pulls-up the second bias voltage by a fourth predefined voltage level;
the second parasitic capacitance pulls-down the second bias voltage by a fifth predefined voltage level; and
the fourth capacitor pulls-up the second bias voltage by a sixth predefined voltage level, wherein the fifth predefined voltage level is equal to a sum of the fourth predefined voltage level and the sixth predefined voltage level such that the effect of coupling by the second parasitic capacitance on the second bias voltage is cancelled.

6. The IO circuit of claim 1, wherein the pre-reverse switch comprises:
a first PMOS transistor coupled to a second PMOS transistor configured to be driven by the first input voltage and the first bias voltage respectively; and
a first NMOS transistor coupled to a second NMOS transistor configured to be driven by the second input voltage and the second bias voltage respectively, wherein the first capacitor is coupled between a gate terminal and a drain terminal of the second PMOS transistor and the second capacitor is coupled between a gate terminal and a drain terminal of the second NMOS transistor.

7. The IO circuit of claim 5, wherein the pre-reverse switch comprises:
a drain terminal of the first PMOS transistor and a source terminal of the second PMOS transistor having a common node, configured to generate a first output voltage;
a drain terminal of the first NMOS transistor and a source terminal of the second NMOS transistor having a common node, configured to generate a second output voltage;

a source terminal of the first PMOS transistor configured to receive a supply voltage; and
a source terminal of the first NMOS transistor configured to receive a ground voltage, wherein the drain terminal of the second PMOS transistor and the drain terminal of the second NMOS transistor having a common node, configured to generate the pre-reverse switch output voltage.

8. The IO circuit of claim 1, wherein the main-driver comprises:
a third PMOS transistor coupled to a fourth PMOS transistor configured to be driven by the first output voltage and the first bias voltage respectively; and
a third NMOS transistor coupled to a fourth NMOS transistor configured to be driven by the second output voltage and the second bias voltage respectively, wherein the fourth PMOS transistor having the first parasitic capacitance between a gate terminal and a drain terminal of the fourth PMOS transistor, and the fourth NMOS transistor having the second parasitic capacitance between a gate terminal and a drain terminal of the fourth NMOS transistor.

9. The IO circuit of claim 7, wherein the main-driver comprises:
a drain terminal of the third PMOS transistor and a source terminal of the fourth PMOS transistor having a common node, configured to generate a third output voltage;
a drain terminal of the third NMOS transistor and a source terminal of the fourth NMOS transistor having a common node, configured to generate a fourth output voltage;
a source terminal of the third PMOS transistor configured to receive a supply voltage; and
a source terminal of the third NMOS transistor configured to receive a ground voltage, wherein the drain terminal of the fourth PMOS transistor and the drain terminal of the fourth NMOS transistor having a common node, configured to generate the main-driver output voltage.

10. The IO circuit of claim 1, wherein the post-reverse switch comprises:
a fifth PMOS transistor coupled to a sixth PMOS transistor configured to be driven by the third output voltage and the first bias voltage respectively; and
a fifth NMOS transistor coupled to a sixth NMOS transistor configured to be driven by the fourth output voltage and the second bias voltage respectively, wherein the third capacitor is coupled between a gate terminal and a drain terminal of the sixth PMOS transistor and the fourth capacitor is coupled between a gate terminal and a drain terminal of the sixth NMOS transistor.

11. The IO circuit of claim 9, wherein the post-reverse switch comprises:
a drain terminal of the fifth PMOS transistor and a source terminal of the sixth PMOS transistor having a common node;
a drain terminal of the fifth NMOS transistor and a source terminal of the sixth NMOS transistor having a common node;
a source terminal of the fifth PMOS transistor configured to receive a supply voltage; and
a source terminal of the fifth NMOS transistor configured to receive a ground voltage, wherein the drain terminal of the sixth PMOS transistor and the drain terminal of the sixth NMOS transistor having a common node, configured to generate the post-reverse switch output voltage.

12. The IO circuit of claim 1, wherein:
the first output voltage is inverse of the first input voltage such that when the first input voltage transitions from logic-LOW to logic-HIGH, the first output voltage transitions from logic-HIGH to logic-LOW;
the second output voltage is inverse of the second input voltage;
the third output voltage is inverse of the first output voltage; and
the fourth output voltage is inverse of the second output voltage.

13. The IO circuit of claim 1, wherein the main-driver output has a voltage swing equaling the supply voltage and the first input voltage and the second input voltage have a voltage swing less than the supply voltage.

14. The IO circuit of claim 1, wherein each transistor in the pre-reverse switch, main-driver and post-reverse switch has a voltage tolerance lesser than the supply voltage.

15. The IO circuit of claim 1, wherein a capacitance of the first capacitor and a capacitance of the third capacitor are less than the first parasitic capacitance of the fourth PMOS transistor and a capacitance of the second capacitor and a capacitance of the fourth capacitor are less than the parasitic capacitance of the fourth NMOS transistor.

16. A method comprising:
receiving a first input voltage and a second input voltage in an input/output (IO) circuit;
generating a first output voltage, a second output voltage and a pre-reverse switch output voltage from the first input voltage and a second input voltage;
coupling the pre-reverse switch output voltage to a first bias voltage and to a second bias voltage;
generating a third output voltage, a fourth output voltage and a main-driver output voltage from the first output voltage and the second output voltage;
coupling the main-driver output voltage to the first bias voltage and to the second bias voltage;
generating a post-reverse switch output voltage from the third output voltage and the fourth output voltage; and
coupling the post-reverse switch output voltage to the first bias voltage and to the second bias voltage, wherein coupling the pre-reverse switch output voltage and the post-reverse switch output voltage to the first bias voltage counter an effect of coupling the main-driver output voltage to the first bias voltage and wherein, coupling the pre-reverse switch output voltage and the post-reverse switch output voltage to the second bias voltage counter an effect of coupling the main-driver output voltage to the second bias voltage.

17. The method of claim 15, wherein coupling the main-driver output voltage to the first bias voltage comprises using a first parasitic capacitance for coupling and coupling the main-driver output voltage to the second bias voltage comprises using a second parasitic capacitance.

18. The method of claim 15, wherein:
coupling the pre-reverse switch output voltage to the first bias voltage pulls-up the first bias voltage by a first predefined voltage level;
coupling the main-driver output voltage to the first bias voltage pulls-down the first bias voltage by a second predefined voltage level; and
coupling the post-reverse switch output voltage to the first bias voltage pulls-up the first bias voltage by a third predefined voltage level, wherein the second predefined voltage level is equal to a sum of the first predefined voltage level and the third predefined voltage level such that the effect of coupling by the first parasitic capacitance on the first bias voltage is cancelled.

19. The method of claim 15, wherein:
coupling the pre-reverse switch output voltage to a second bias voltage pulls-up the second bias voltage by a fourth predefined voltage level;
coupling the main-driver output voltage to the second bias voltage pulls-down the second bias voltage by a fifth predefined voltage level; and
coupling the post-reverse switch output voltage to the second bias voltage pulls-up the second bias voltage by a sixth predefined voltage level, wherein the fifth predefined voltage level is equal to a sum of the fourth predefined voltage level and the sixth predefined voltage level such that the effect of coupling by the second parasitic capacitance on the second bias voltage is cancelled.

20. The method of claim 15, wherein generating a first output voltage and a second output voltage from the first input voltage and a second input voltage further comprises inverting the first input voltage to generate the first output voltage and inverting the second input voltage to generate the second output voltage.

21. The method of claim 15, wherein generating a third output voltage and a fourth output voltage from the first output voltage and the second output voltage further comprises inverting the first output voltage to generate the third output voltage and inverting the second output voltage to generate the fourth output voltage.

\* \* \* \* \*